United States Patent [19]

Hoshi

[11] Patent Number: 4,937,479

[45] Date of Patent: Jun. 26, 1990

[54] DATA LATCH CIRCUIT WITH IMPROVED DATA WRITE CONTROL FUNCTION

[75] Inventor: Katsuji Hoshi, Tokyo, Japan

[73] Assignee: NEC Corporation, Tokyo, Japan

[21] Appl. No.: 303,877

[22] Filed: Jan. 30, 1989

[30] Foreign Application Priority Data

Jan. 30, 1988 [JP] Japan .................................. 63-19748

[51] Int. Cl.$^5$ ..................... H03K 3/356; H03K 3/013; H03K 17/04; H03K 19/01

[52] U.S. Cl. .................................... 307/530; 307/279; 307/291; 365/189.05; 365/203; 365/205

[58] Field of Search ............... 307/530, 555, 475, 279, 307/269, 603, 291, 292, 446, 448, 247.1, 272.2; 365/189.05, 191, 192, 195, 196, 203, 205, 207, 208, 154, 233

[56] References Cited

U.S. PATENT DOCUMENTS

| | | | |
|---|---|---|---|
| 4,417,163 | 11/1983 | Otsuki et al. | 307/475 |
| 4,442,365 | 4/1984 | Nagami | 307/279 |
| 4,458,337 | 7/1984 | Takemae et al. | 365/189.05 |
| 4,542,306 | 9/1985 | Ikeda | 307/272.2 |
| 4,785,206 | 11/1988 | Hoshi | 307/530 |

Primary Examiner—Stanley D. Miller
Assistant Examiner—David R. Bertelson
Attorney, Agent, or Firm—Helfgott & Karas

[57] ABSTRACT

A latch circuit includes a current source, and a flip-flop amplifier circuit having a pair of first and second input terminals for comparing a reference voltage and an external input voltage with each other and amplifying the voltage difference therebetween in response to inputting of an activating signal. A first transistor has a source terminal, a drain terminal connected to the first input terminal of the flip-flop amplification circuit, and a gate terminal receptive of the external input voltage. A second transistor has a source terminal connected to the source terminal of the first transistor, a drain terminal connected to the second input terminal of the flip-flop amplification circuit, and a gate terminal receptive of the reference voltage. A pair of gate elements are connected in series between the sources of the first and second transistors and the current source, and operate after the completion of amplification of the voltage difference in the flip-flop amplifier circuit for cutting off a drain current flowing through the first and second transistors so as to enable the flip-flop amplifier circuit to latch the external input voltage.

5 Claims, 2 Drawing Sheets

DATA LATCH CIRCUIT WITH IMPROVED DATA WRITE CONTROL FUNCTION

BACKGROUND OF THE INVENTION

1. Field of the Invention

The present invention relates, to a data latch circuit such as inverter circuit composed of semiconductor elements and having simplified latching function.

2. Prior Art

Recently, various types of input inverter circuits are proposed and used in the field of IC memory. In order to stably and properly operate the IC memory, the input inverter circuits are required to have features such as a narrow non-sensitive region with respect to the determination of input level, a latching function for an external input voltage, a simplified structure of the input inverter circuitry and a small electric current consumption. The following description is directed to the inverter circuit composed of metal oxide semiconductor transistors (hereinafter, referred to as "MOST") which are typical of insulated-gate type field effect transistors, and particularly N-channel MOSTs are used as examples. However, the inverter circuit may be composed of P-channel MOSTs or bipolar transistors.

FIG. 1 shows an example of principal structure of the conventional input inverter circuit. The illustrated input inverter circuit is comprised of an enhancement type metal oxide semiconductor transistor (hereinafter, referred to as "EMOST") J1 for sampling an external input voltage $V_{IN}$, an EMOST J2 for sampling a reference voltage $V_{REF}$, an EMOST J3 connected at its gate terminal to the source terminal of the EMOST J1, an EMOST J4 connected at its gate terminal to the source terminal of the EMOST J2, a flip-flop differential voltage amplifier circuit 1 for comparing the external input voltage $V_{IN}$ and the reference voltage $V_{REF}$ to each other and amplifying the voltage difference therebetween, and a flip-flop current-amplifier circuit 5 for current-amplifying the output from the flip-flop differential voltage amplifier circuit 1. In this circuit, the reference voltage $V_{REF}$ is outputted from a reference voltage generating circuit formed in a portion of semiconductor substrate other than the area on which the input inverter circuit is formed. The input inverter circuit 1 compares the external input voltage $V_{IN}$ with the reference voltage $V_{REF}$ as a reference level to process the external input voltage.

FIG. 2 is a detailed circuit diagram of the conventional input inverter circuit shown in FIG. 2. This circuit exemplifies an input inverter circuit used in a MOS dynamic RAM of the conventional 5 V-single-power source type IC. As shown in FIG. 2, a plurality of EMOSTs J5-J12 constitute the flip-flop differential voltage amplifier circuit 1, and a plurality of EMOSTs J13-J24 constitute the flip-flop current-amplifier circuit 5.

Next, operation of the conventional input inverter circuit will be explained with reference to FIG. 2. In the initial stage, since a pre-charge signal $\phi_P$ is set to a high voltage level (hereinafter, referred to as "high level") sufficiently exceeding a threshold voltage level $V_T$ of the EMOSTs, the EMOSTs J9, J10, J21, J22, J23 and J24, all receptive of the pre-charge signal $\phi_P$ as their gate input signal, are activated so that nodes N3 and N4 are held at the high level, and nodes N5 and N6 as well as output signals $\phi_{02}$ and $\overline{\phi_{02}}$ are held at a low voltage level (hereinafter, referred to as "low level") lower than the threshold voltage level $V_T$. Thereafter, the precharge signal $\phi_P$ is turned to the low level. On the other hand, when a latching signal $\phi_L$ is turned from the high level to the low level, the EMOSTs J1 and J2 are turned off so that the external input voltage $V_{IN}$ and the reference voltage $V_{REF}$ are latched at nodes N1 and N2, respectively. When a first activating signal $\phi_1$ is turned from the low level to the high level, the potentials of nodes No and $\overline{No}$ are boosted. At this time, a voltage difference is produced between the node No and node $\overline{No}$ by means of the EMOST J3 connected at its input gate terminal to the node N1 at which the external input voltage $V_{IN}$ is latched and by means of the EMOST J4 connected at its input gate terminal to the node N2 at which the reference voltage $V_{REF}$ is latched. A pair of EMOSTs J7 and J8, which constitute a flip-flop, are operated by the voltage difference between the node No and Node $\overline{No}$ so that one of the nodes N4 and N3 is turned to the low level by means of the EMOST J12 connected at its input gate terminal to the node No and the EMOST J11 connected at its input gate terminal to the node $\overline{No}$, and therefore one of the EMOST J6 connected at its input gate terminal to the node 4 and the EMOST J5 connected at its input gate terminal to the node N3 is deactivated (hereinafter, this condition is referred to as "OFF"). Subsequently, when a second activating signal $\phi_2$ is turned from the low level to the high level, one of the nodes N5 and N6 is held at the high level through activated one of the EMOST J13 connected at its input gate terminal to the node No and the EMOST J14 connected at its input gate terminal to the node $\overline{No}$. One of the EMOST J17 connected at its input gate terminal to the node N5 and the EMOST J18 connected at its input gate terminal to the node N6 is activated, and a current-amplified signal is outputted at one of the nodal outputs $\phi_{02}$ and $\overline{\phi_{02}}$. At this stage, the nodal output $\phi_{02}$ has the same phase as that of the external input voltage $V_{IN}$, and the nodal output $\overline{\phi_{02}}$ has the opposite phase to that of the external input voltage $V_{IN}$.

However, in the above-described conventional circuitry structure, when the external input voltage $V_{IN}$ is at the high level, the node No is held at the high level. In this state, since the EMOST J4 receptive of the reference voltage $V_{REF}$ as its gate input signal is always held at the activated state, a current flows from the node No held at the high level to the ground (hereinafter, referred to as "GND") to thereby increase the current consumption. In addition, since the EMOST J4 is always held in the activated state, the flip-flop differential voltage amplifier circuit of the conventional circuitry cannot hold information represented by the external input voltage $V_{IN}$. Consequently, an additional flip-flop is needed in the flip-flop differential voltage amplifier circuit to hold the information of external input voltage $V_{IN}$, so that the flip-flop differential voltage amplifier circuit is complicated and requires a lot of EMOSTs. Further, in the conventional circuitry, during the activation of flip-flop differential voltage amplifier circuit, if the external input voltage $V_{IN}$ is fluctuated, the EMOSTs J1 and J2 and the latching signal $\phi_L$ to be fed to the input gate terminals thereof are needed in order to properly carry out the differential voltage amplification.

SUMMARY OF THE INVENTION

In order to remove the above-noted drawbacks of the conventional circuit, an object of the present invention is to provide an improved inverter circuit which operates stably, and has a simplified structure and a relatively low current consumption.

According to the present invention, in an input inverter circuit including a flip-flop circuit as a main component for comparing an external input voltage with a reference voltage outputted from a reference voltage generating circuit and for amplifying the voltage difference therebetween in response to inputting of an activating signal, the improvement is comprised of a first transistor having a drain terminal connected to a first input terminal of the flip-flop circuit and a gate terminal connected to receive the external input voltage, a second transistor having a drain terminal connected to a second input terminal of the flip-flop circuit, a gate terminal connected to receive the reference voltage and a source terminal connected to a source terminal of the first transistor, a first gate element connected at its one terminal to a power source and controlled by a signal produced within the flip-flop circuit, and a second gate element connected at its one terminal to the source terminals of first and second transistors, connected at its other terminal to the other terminal of the first gate element and controlled by another signal produced within the flip-flop circuit.

In operation of the above-described inventive inverter circuit, a direct current flowing at the drain terminals of the first and second transistors receptive of the external input voltage and the reference voltage as their gate input signals is controlled by means of the first and second gate elements which are controlled by the signals produced within the inverter circuit. Namely, by turning off one of the first and second gate elements, the drain terminals of the first and second transistors receptive of the external input voltage and the reference voltage are blocked. Consequently, the input inverter circuit consumes a relatively low electric current. In addition, the flip-flop circuit can hold the information represented by the external input voltage, and the flip-flop circuit can properly hold the information even if the external input voltage $V_{IN}$ is fluctuated after the completion of the differential voltage amplification.

DETAILED DESCRIPTION OF THE INVENTION

Figure 1:
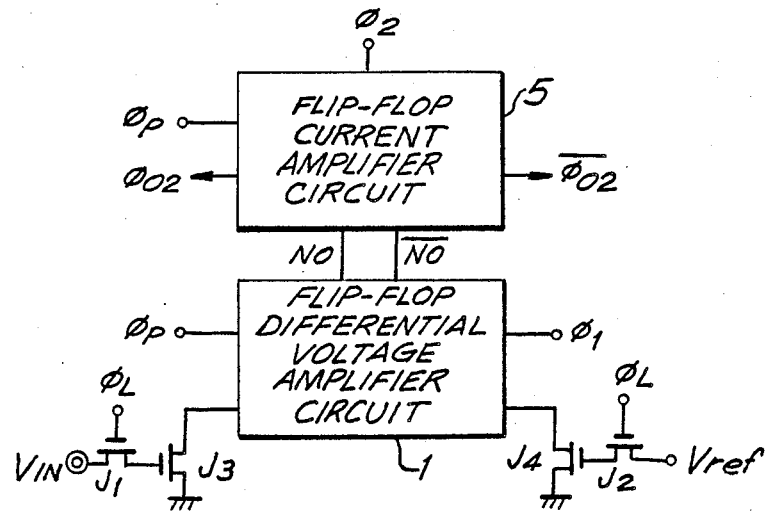
FIG. 1 is a schematic circuit block diagram showing the conventional input inverter circuit.
Figure 3:
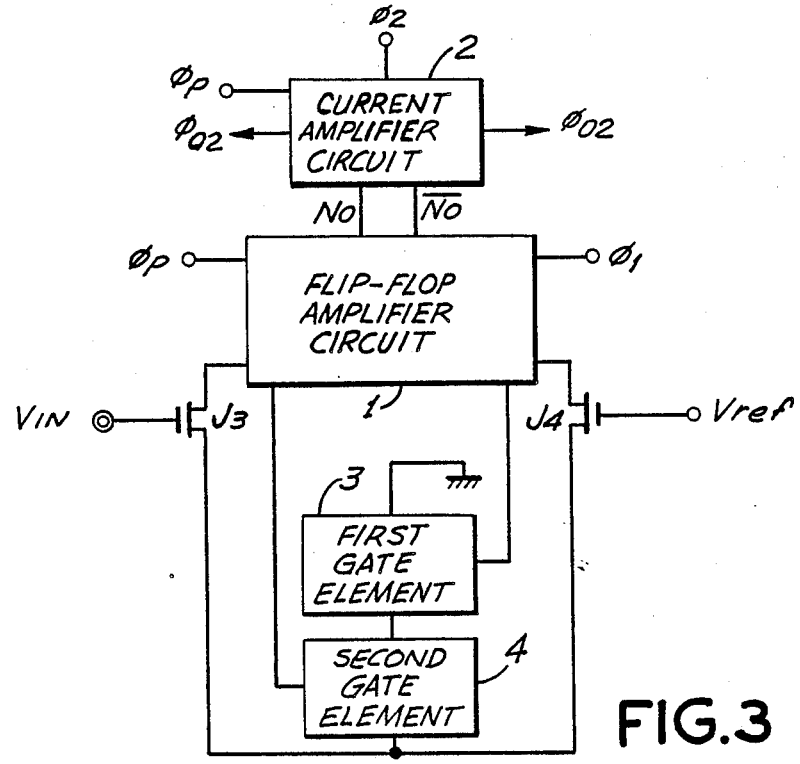
FIG. 3 is a schematic circuit block diagram showing one embodiment of the input inverter circuit according to the present invention.

Next, an embodiment of the present invention will be explained in conjunction with the drawings. FIG. 3 is a circuit block diagram showing the embodiment of an input inverter circuit according to the present invention. In the figure, the same reference numerals are used for the same elements and parts appearing in FIG. 1. The input inverter circuit is comprised of, as main components, a flip-flop amplifier circuit 1 for differential voltage amplification and a current-amplifier circuit 2 for output-current amplification. The flip-flop amplifier circuit 1 is responsive to inputting of a first activating signal $\phi_1$ to compare a reference voltage $V_{REF}$ outputted from a reference voltage generating circuit (not shown) with an external input voltage $V_{IN}$ to thereby output an amplified signal. The current-amplifier circuit 2 is receptive of the amplified signal and responsive to inputting of a second activating signal $\phi_2$ to output a current-amplified signal.

The flip-flop amplifier circuit 1 is provided with an EMOST J3 having an input gate terminal responsive to and receptive of the external input voltage $V_{IN}$, an EMOST J4 having an input gate terminal responsive to and receptive of the reference voltage $V_{REF}$, and a pair of first gate element 3 and second gate element 4 for controlling drain currents flowing through the EMOST J3 and EMOST J4. In this embodiment, the EMOST J3 receptive of the external input voltage $V_{IN}$ as the gate input signal and the EMOST J4 receptive of the reference voltage $V_{REF}$ can set voltages of particular nodes within the flip-flop amplifier circuit 1 to the low levels, respectively, in the initial stage. The EMOST J3 receptive of the external input voltage $V_{IN}$ as its gate input signal and the EMOST J4 receptive of the reference voltage $V_{REF}$ can produce, within the flip-flop amplifier circuit 1, internal signals effective to control the electric current flowing through the first and second gate elements 3 and 4. By such control, the flip-flop amplifier circuit 1 can be stably operated and can hold therein the information represented by the external input voltage $V_{IN}$.

Figure 4:
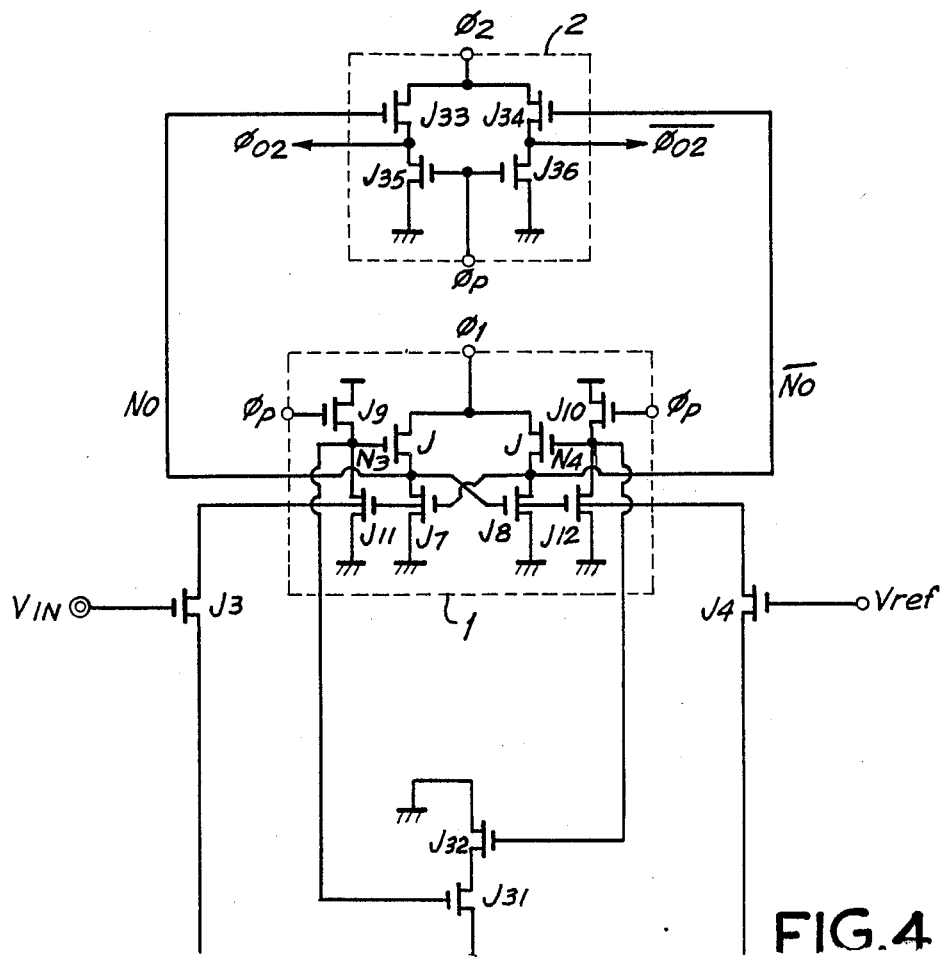
FIG. 4 is a detailed circuit diagram of the input inverter circuit shown in FIG. 3.

FIG. 4 is a detailed circuit diagram of the embodiment shown in FIG. 3. In the figure, the same reference numerals are used for the same elements and parts appearing in the circuit of FIG. 4. As apparent from the comparison of FIG. 2 and FIG. 4 with each other, the flip-flop amplifier circuit 1 shown in FIG. 2 is constructed in a manner similar to the flip-flop differential voltage amplifier circuit 1 shown in FIG. 2.

Figure 2:
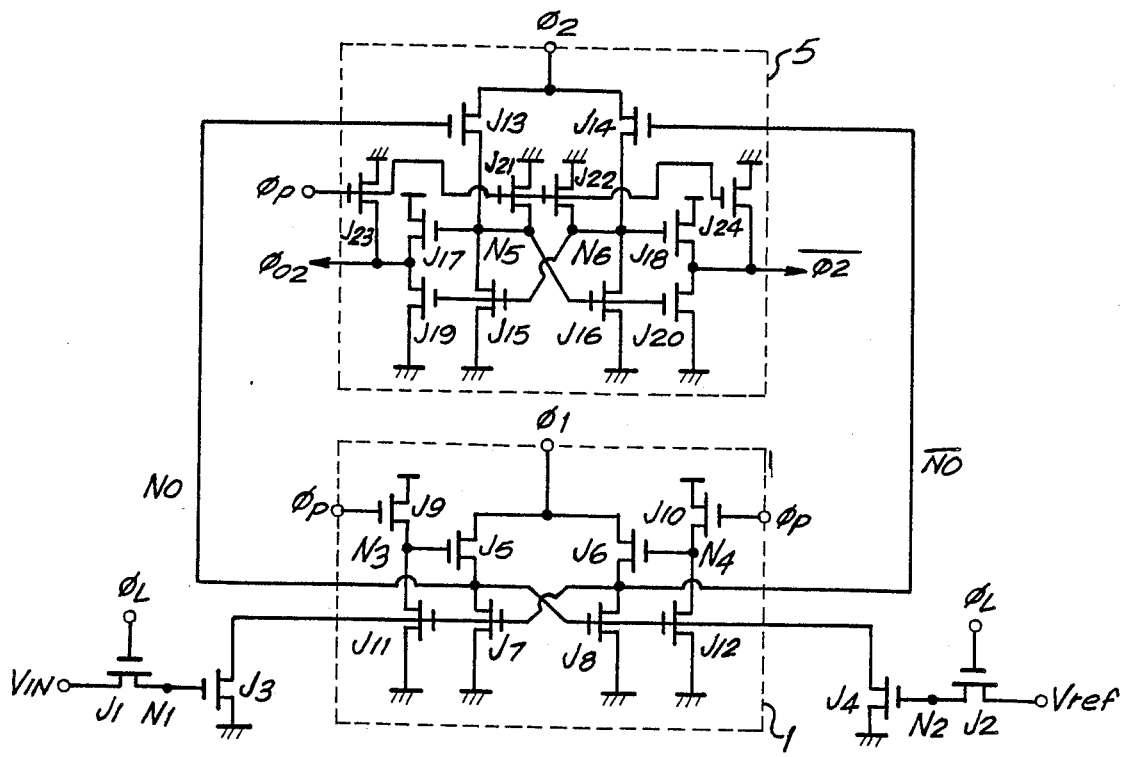
FIG. 2 is a detailed circuit diagram of the conventional input inverter circuit shown in FIG. 1.

The current-amplifier circuit 2 is composed of EMOSTs J33, J34, J35 and J35 connected to one another as shown in FIG. 2, and has a relatively simple circuitry structure as compared to the flip-flop current-amplifier circuit 5 shown in FIG. 2. Further, the first gate element is composed of an EMOST J32 and the second gate element is composed of an EMOST J31. The gate terminal of EMOST J32 is connected to a node N4 within the flip-flop amplifier circuit 1, and the gate terminal of EMOST J31 is connected to another node N3 within the flip-flop amplifier circuit 1.

The operation of the present embodiment will be explained hereinafter with reference to FIG. 4. In the initial stage, when a pre-charge signal $\phi_P$ is switched from the low level to the high level, EMOSTs J9 and J10 receptive of the pre-charge signal $\phi_P$ as their gate input signal are operated to hold the respective nodes N3 and N4 at the high level. At the same time, the EMOSTs J35 and J36 receptive of the pre-charge signal $\phi_P$ as their gate input signal are operated to hold nodal output signals $\phi_{o2}$ and $\overline{\phi_{o2}}$ at the low level. Thereafter, the pre-charge signal $\phi_P$ is returned from the high level to the low level.

When the first activating signal $\phi_1$ is turned from the low level to the high level, the EMOST J3 receptive of the external input voltage $V_{IN}$ as its gate input signal and the EMOST J4 receptive of the reference voltage $V_{REF}$ as its gate input signal produce the voltage difference between the node No and the node $\overline{No}$. This voltage difference is amplified by the EMOSTs J7 and J8 which constitute the flip-flop, and one of the node N3 corresponding to the node No and the node N4 corresponding to the node $\overline{No}$ is turned to the low level by means of the EMOST J11, the input gate terminal of which is connected to the node No, and by means of the EMOST J12, the input gate terminal of which is connected to the node $\overline{No}$, so that one of the EMOST J31, the input gate terminal of which is connected to the node N3, and the EMOST J32, the input gate terminal of which is connected to the node N4, is turned off.

When the second activating signal $\phi_2$ is turned from the low level to the high level, the current-amplified signal is outputted at one of the output nodes $\phi_{02}$ and $\overline{\phi_{02}}$ through one of the EMOST J33, the input gate terminal of which is connected to the node No, and the EMOST J34, the input gate terminal of which is connected to the node $\overline{No}$. At this time, the phase of current-amplified signal at the node $\phi_{02}$ is the same as that of the external input voltage $V_{IN}$, and the phase of current-amplified signal at the node $\overline{\phi_{02}}$ is opposite to that of the external input voltage $V_{IN}$.

As described above, in the input inverter circuit according to the present invention, the drain current flowing through the EMOST J3 receptive of the external input voltage $V_{IN}$ as its gage input signal and flowing through the EMOST J4 receptive of the reference voltage $V_{REF}$ as its gate input signal is cut off by means of the first gate element J31 receptive of the internal signal as its gate input signal developed at the node N3 and by means of the second gate element J32 receptive of the internal signal as its gate input signal developed at the node N4. By cutting off the drain current flowing through the EMOSTs J3 and J4, the information represented by the external input voltage $V_{IN}$ can be stored within the flip-flop amplifier circuit 1. Further, after the voltage difference has been amplified, even if the external input voltage $V_{IN}$ is fluctuated, the flip-flop amplifier circuit has a latching function to properly hold the information. Thus, an additional latching circuit or the use of complicated latching signal is not needed. In addition, the simplification of current amplifier circuit and the reduction of power consumption in the flip-flop amplifier circuit, which would be difficult in the conventional circuit, can be realized.

As described above, the inventive input inverter circuit has advantages such as the information represented by the external input signal can be held in the flip-flop amplifier circuit, the flip-flop amplifier circuit has the latching function to properly hold the information even if the external input voltage $V_{IN}$ is fluctuated after the completion of voltage difference amplification so that the latching circuit and latching signals are simplified, and further the simplification of current amplifier circuit and the reduction of power consumption in the flip-flop amplifier circuit, which would be impossible in the conventional circuit, can be realized.

Consequently, according to the invention, the simplified input inverter circuit having an automatic latching function and a reduced power consumption can be obtained for processing the external logic information.

What is claimed is:

1. A latch circuit comprising a flip-flop circuit having a pair of first and second input nodes and first and second output nodes and a first terminal receiving an input signal, a second terminal receiving a reference voltage, a first transistor connected between said first input node and a common node, a second transistor connected between said second input node and said common node, first means for connecting said first terminal to a gate of said first transistor, second means for connecting said second terminal to a gate of said second transistor, a series circuit of third and fourth transistors connected between said common node and a source voltage source, third means connected between said first output node and a gate of said third transistor for controlling said third transistor in response to a level at said first output node, fourth means connected between said second node and a gate of said fourth transistor and controlling said fourth transistor in response to a level at said second output node, said first and second output nodes being charged to an active level before amplifying operation of said flip-flop circuit and one of said first and second output nodes being changed to an inactive level after amplifying operation of said flip-flop circuit.

2. A latch circuit comprising a flip-flop circuit for comparing a reference voltage outputted from a reference voltage generating circuit with an external input voltage in response to inputting of an activating signal and for amplifying the compared result, a first transistor having a drain terminal connected to a first input terminal of the flip-flop circuit, and a gate terminal connected to receive the external input voltage; a second transistor having a drain terminal connected to a second input terminal of the flip-flop circuit, a gate terminal connected to receive the reference voltage, and a source terminal connected to a source terminal of the second transistor; a first gate element having a terminal connected to a power source and being controlled by a control signal produced within the flip-flop circuit; and a second gate element having a terminal connected to the source terminals of the first and second transistors and another terminal connected to another terminal of the first gate element, and being controlled by another control signal produced within the flip-flop circuit.

3. A latch circuit according to claim 2; wherein each gate element comprises an enhancement type transistor.

4. A latch circuit according to claim 2; including a current-amplifier circuit for current-amplifying an output from the flip-flop circuit.

5. A latch circuit according to claim 4; wherein the current-amplifier circuit comprises a pair of two series-connected transistors, the pair being connected in parallel to each other.

* * * * *

REEXAMINATION CERTIFICATE (1756th)
United States Patent [19]
Hoshi

[11] B1 4,937,479

[45] Certificate Issued * Jul. 21, 1992

[54] DATA LATCH CIRCUIT WITH IMPROVED DATA WRITE CONTROL FUNCTION

[75] Inventor: Katsuji Hoshi, Tokyo, Japan

[73] Assignee: NEC Corporation

Reexamination Request:
No. 90/002,562, Feb. 11, 1992

Reexamination Certificate for:
Patent No.: 4,937,479
Issued: Jun. 26, 1990
Appl. No.: 303,877
Filed: Jan. 30, 1989

[*] Notice: The portion of the term of this patent subsequent to Nov. 15, 2005 has been disclaimed.

[30] Foreign Application Priority Data

Jan. 30, 1988 [JP] Japan ................... 63-19748

[51] Int. Cl.$^5$ ............... H03K 3/356; H03K 3/013; H03K 17/04; H03K 19/01
[52] U.S. Cl. .................... 307/530; 307/279; 307/291; 365/189.05; 365/203; 365/205
[58] Field of Search ............ 307/279, 291, 530, 443, 307/448, 272.2; 365/203, 205, 189.05, 230.08

[56] References Cited

U.S. PATENT DOCUMENTS 4,785,206 11/1988 Hoshi ..................... 307/530

*Primary Examiner*—D. R. Hudspeth

[57] ABSTRACT

A latch circuit includes a current source, and a flip-flop amplifier circuit having a pair of first and second input terminals for comparing a reference voltage and an external input voltage with each other and amplifying the voltage difference therebetween in response to inputting of an activating signal. A first transistor has a source terminal, a drain terminal connected to the first input terminal of the flip-flop amplification circuit, and a gate terminal receptive of the external input voltage. A second transistor has a source terminal connected to the source terminal of the first transistor, a drain terminal connected to the second input terminal of the flip-flop amplification circuit, and a gate terminal receptive of the reference voltage. A pair of gate elements are connected in series between the sources of the first and second transistors and the current source, and operate after the completion of amplification of the voltage difference in the flip-flop amplifier circuit for cutting off a drain current flowing through the first and second transistors so as to enable the flip-flop amplifier circuit to latch the external input voltage.

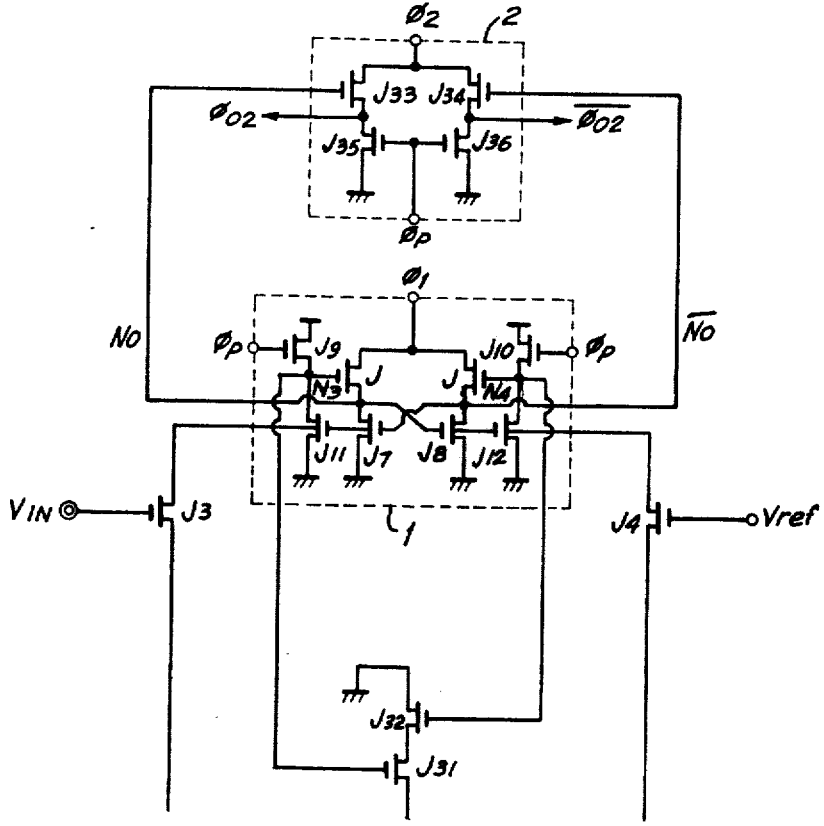

REEXAMINATION CERTIFICATE ISSUED UNDER 35 U.S.C. 307

THE PATENT IS HEREBY AMENDED AS INDICATED BELOW.

Matter enclosed in heavy brackets [] appeared in the patent, but has been deleted and is no longer a part of the patent; matter printed in italics indicates additions made to the patent.

ONLY THOSE PARAGRAPHS OF THE SPECIFICATION AFFECTED BY AMENDMENT ARE PRINTED HEREIN.

Column 4, lines 29–36; col. 4, lines 37–47; col. 5, lines 20–42:

FIG. 4 is a detailed circuit diagram of the embodiment shown in FIG. 3. In the figure, the same reference numerals are used for the same elements and parts appearing in the circuit of FIG. [4] *2*. As apparent from the comparison of FIG. 2 and FIG. 4 with each other, the flip-flop amplifier circuit 1 shown in FIG. [2] *4* is constructed in a manner similar to the flip-flop differential voltage amplifier circuit 1 shown in FIG. 2.

The current-amplifier circuit 2 is composed of EMOSTs J33, J34, J35 and [J35] *J36* connected to one another as shown in FIG. [2]*4*, and has a relatively simple circuitry structure as compared to the flip-flop current-amplifier circuit 5 shown in FIG. 2. Further, the first gate element is composed of an EMOST J32 and the second gate element is composed of an EMOST J31. The gate terminal of EMOST J32 is connected to a node N4 within the flip-flop amplifier circuit 1, and the gate terminal of EMOST J31 is connected to another node N3 within the flip-flop amplifier circuit 1. As described above, in the input inverter circuit according to the present invention, the drain current flowing through the EMOST J3 receptive of the external input voltage $V_{IN}$ as its [gage] *gate* input signal and flowing through the EMOST J4 receptive of the reference voltage $V_{REF}$ as its gate input signal is cut off by means of the first gate element J31 receptive of the internal signal as its gate input signal developed at the node N3 and by means of the second gate element J32 receptive of the internal signal as its gate input signal developed at the node N4. By cutting off the drain current flowing through the EMOSTs J3 and J4, the information represented by the external input voltage $V_{IN}$ can be stored within the flip-flop amplifier circuit 1. Further, after the voltage difference has been amplified, even if the external input voltage $V_{IN}$ is fluctuated, the flip-flop amplifier circuit has a latching function to properly hold the information. Thus, an additional latching circuit or the use of complicated latching signal is not needed. In addition, the simplification of current amplifier circuit and the reduction of power consumption in the flip-flop amplifier circuit, which would be difficult in the conventional circuit, can be realized.

AS A RESULT OF REEXAMINATION, IT HAS BEEN DETERMINED THAT:

The patentability of claims 2–4 is confirmed.

Claims 1 and 5 are determined to be patentable as amended.

1. A latch circuit comprising a flip-flop circuit having a pair of first and second input nodes and first and second output nodes and a first terminal receiving an input signal, a second terminal receiving a reference voltage, a first transistor connected between said first input [hode] *node* and a common node, a second transistor connected between said second input node and said common node, first means for connecting said first terminal to a gate of said first transistor, second means for connecting said second terminal to a gate of said second transistor, a series circuit of third and fourth transistors connected between said common node and a source voltage source, third means connected between said first output node and a gate of said third transistor for controlling said third transistor in response to a level at said first output node, fourth means connected between said second *output* node and a gate of said fourth transistor and controlling said fourth transistor in response to a level at said second output node, said first and second output nodes being charged to an active level before an amplifying operation of said flip-flop circuit and one of said first and second output nodes being changed to an inactive level after the amplifying operation of said flip-flop circuit.

5. A latch circuit according to claim 4; wherein the current-amplifier circuit comprises a pair of *sets of two series-connected transistors,* [the pair] *said sets* being connected in parallel to each other.

* * * * *